US009324945B2

(12) United States Patent
Liu et al.

(10) Patent No.: US 9,324,945 B2
(45) Date of Patent: Apr. 26, 2016

(54) MEMORY CELLS AND METHODS OF FORMING MEMORY CELLS

(71) Applicant: Micron Technology, Inc., Boise, ID (US)

(72) Inventors: Lequn Jennifer Liu, Boise, ID (US); Stephen W. Russell, Boise, ID (US); Fabio Pellizzer, Cornate d'Adda (IT); Swapnil Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 13/959,958

(22) Filed: Aug. 6, 2013

(65) Prior Publication Data

US 2015/0041749 A1 Feb. 12, 2015

(51) Int. Cl.
*H01L 45/00* (2006.01)
*H01L 27/24* (2006.01)

(52) U.S. Cl.
CPC .......... *H01L 45/165* (2013.01); *H01L 27/2427* (2013.01); *H01L 45/06* (2013.01); *H01L 45/1233* (2013.01); *H01L 45/1253* (2013.01); *H01L 45/144* (2013.01); *H01L 45/1675* (2013.01)

(58) Field of Classification Search
None
See application file for complete search history.

(56) References Cited

U.S. PATENT DOCUMENTS

2011/0217817 A1* 9/2011 Kim ............................... 438/238
2012/0241705 A1* 9/2012 Bresolin et al. ................... 257/2

* cited by examiner

*Primary Examiner* — Bilkis Jahan
*Assistant Examiner* — Kevin Quinto
(74) *Attorney, Agent, or Firm* — Wells St. John, P.S.

(57) ABSTRACT

A method of forming a memory cell includes forming an outer electrode material elevationally over and directly against a programmable material. The programmable material and the outer electrode material contact one another along an interface. Protective material is formed elevationally over the outer electrode material. Dopant is implanted through the protective material into the outer electrode material and the programmable material and across the interface to enhance adhesion of the outer electrode material and the programmable material relative one another across the interface. Memory cells are also disclosed.

48 Claims, 7 Drawing Sheets

MEMORY CELLS AND METHODS OF FORMING MEMORY CELLS

TECHNICAL FIELD

Embodiments disclosed herein pertain to memory cells and to methods of forming memory cells.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds, or less.

The memory cells are configured to retain or store memory in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. There is a continuing effort to reduce the number of components in individual devices because such can reduce the size of finished constructions and simplify processing. The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell comprises determination of which of the states the programmable material is in, and the writing of information to the cell comprises placing the programmable material in a predetermined state. Some programmable materials retain a memory state in the absence of refresh, and thus may be incorporated into nonvolatile memory cells.

Phase change materials, such as ovonic memory materials (for instance, various chalcogenides), are being considered for use as programmable materials in memory cells. The phase change materials transform from one phase to another through application of appropriate electrical stimulus, with each phase corresponding to a different memory state.

Figure 1:
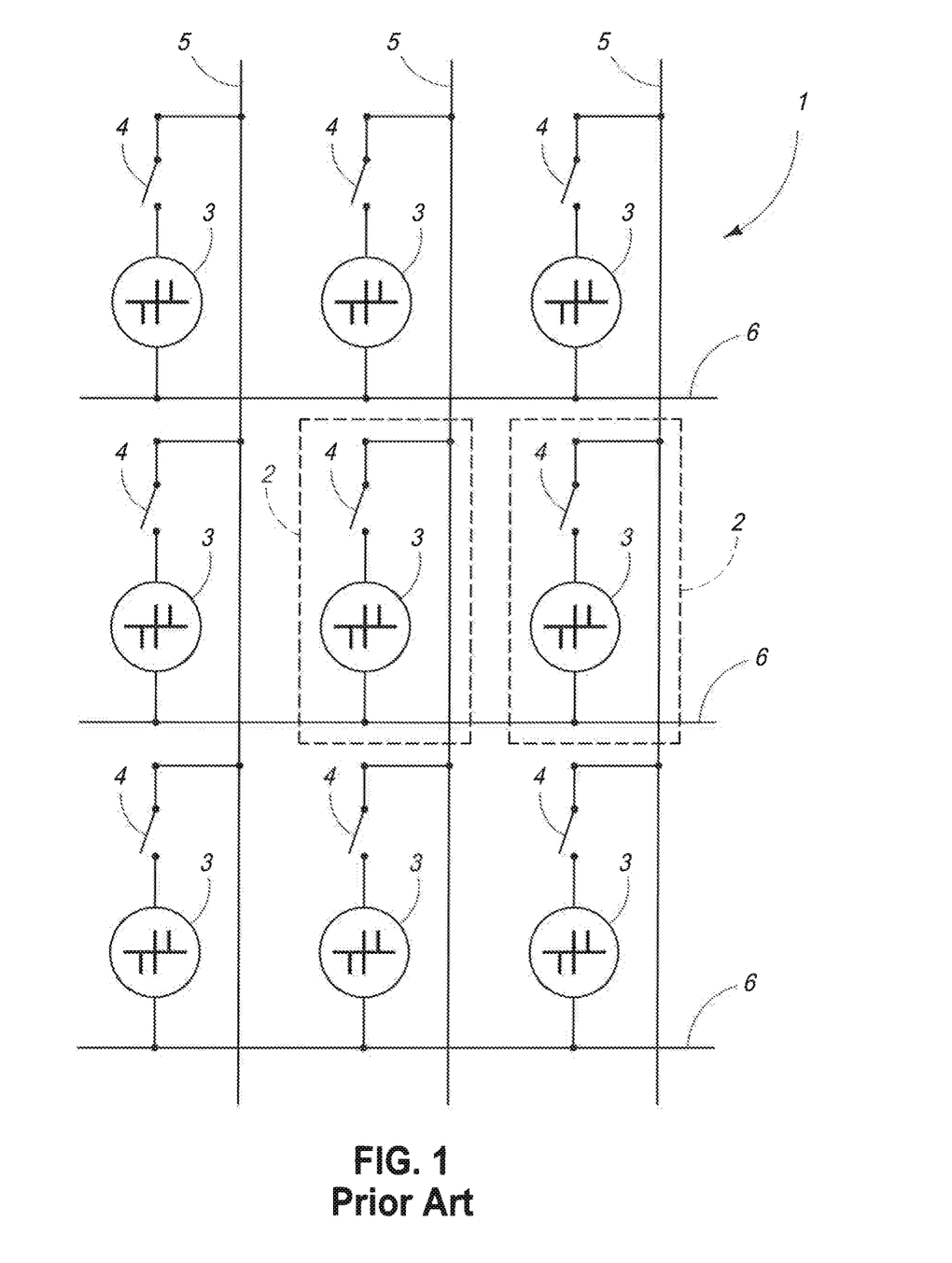
FIG. 1 schematically illustrates an example prior art memory array.

An example prior art memory array 1 is shown in FIG. 1, and which comprises chalcogenide phase change memory elements. Memory array 1 comprises a plurality of memory cells 2, each including a memory element 3 of the phase change type and a select device 4. Memory cells 2 are interposed at cross-points between row lines 6 (also called wordlines or access lines) and column lines 5 (also called bitlines or sense lines). In each memory cell 2, memory element 3 has a first terminal connected to a wordline 6 and a second terminal connected to a select device 4. The select device 4 has a second terminal connected to a bitline 5.

A problem that may be encountered in the use of chalcogenide materials as memory elements and/or as select devices is that it can be difficult to adhere chalcogenide material to various other materials. Accordingly, delamination of chalcogenide material from adjacent materials may occur. Such delamination can be detrimental to memory cell performance, and in some cases may lead to failure of memory cells.

It would be desirable to develop improved memory cells having better adherence of chalcogenide materials to adjacent materials.

DETAILED DESCRIPTION OF EXAMPLE EMBODIMENTS

Figure 2:
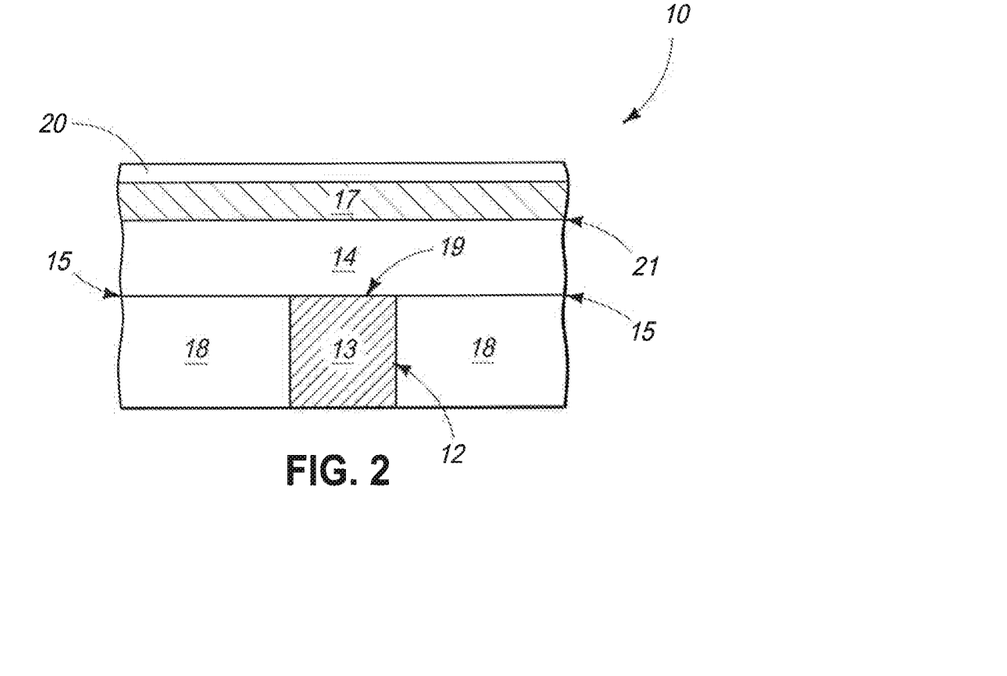
FIG. 2 is a diagrammatic sectional view of a substrate fragment in process in accordance with an embodiment of the invention.

Memory cells and methods of forming memory cells in accordance with some embodiments of the invention are initially described with reference to FIGS. 2-7. Referring to FIG. 2, an example substrate fragment 10 is shown. Substrate 10 may comprise a semiconductor substrate. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other material thereon), and semiconductive material layers (either alone or in assemblies comprising other material). The term "substrate" refers to any supporting structure, including, but not limited to, the semiconductive substrates described above.

Any of the materials and/or structures described herein may be homogenous or non-homogenous, and regardless may be continuous or discontinuous over any material which such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s)

result(s) in no physical touching contact of the stated materials or structures relative one another. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Substrate 10 comprises dielectric material 18 and elevationally inner electrode material 13 extending there-through (e.g., vertically). In this document, "horizontal" refers to a general direction along a primary surface relative to which the substrate is processed during fabrication, and "vertical" is a direction generally orthogonal thereto. Further as used herein, "vertical" and "horizontal" are generally perpendicular directions relative one another independent of orientation of the substrate in three-dimensional space. Further, "elevational" and "elevationally" are generally with reference to the vertical direction. Example dielectric materials 18 are doped silicon dioxide, undoped silicon dioxide, and/or silicon nitride. Other partially or wholly fabricated components of integrated circuitry may be formed as a part of or be elevationally inward of materials 13 and 18, and are not particularly germane to the inventions disclosed herein. Inner electrode material 13 may be patterned to form a first or inner electrode 12, as shown.

A programmable material 14 has been formed elevationally over inner electrode material 13, and in one embodiment has been formed directly against inner electrode material 13. The programmable material 14 may comprise any suitable composition or combination of compositions, and whether existing or yet-to-be-developed. One example is a chalcogenide material that may selectively and reversibly undergo phase change to obtain different programmed resistance values. Specific such examples include combinations of germanium, antimony, tellurium and/or indium, such as GeSbTe and/or InGeTe. Formulas as used herein indicate the components within listed compounds/mixtures rather than necessarily designating specific stoichiometries of such components. Suitable thickness can be selected by the artisan.

An outer electrode material 17 has been formed elevationally over and may be directly against programmable material 14. The inner and outer electrode materials may comprise any suitable composition(s) or combination(s) of compositions, may be the same composition as one another in some embodiments, and may differ in composition from one another in other embodiments. In some embodiments, the first and second electrode materials may comprise one or more of titanium, aluminum, carbon, and tungsten. For instance, the first and second electrode materials may comprise, consist essentially of, or consist of, one or more of TiSiN, TiAlN, TiN, WN, Ti, C, and W. In some embodiments, the inner or outer electrode material may comprise "heater material" that is used to thermally induce a phase change in the programmable material, with TiSiN being an example.

Programmable material 14 and outer electrode material 17 may contact one another along an interface 21 when such are directly against one another, as shown. Programmable material 14 and inner electrode material 13 may contact one another along an interface 19 when such are directly against one another, as shown. Programmable material 14 and dielectric material 18 may contact one another along an interface 15 when such are directly against one another, as shown.

Protective material 20 has been formed elevationally over outer electrode material 17, and in one embodiment directly against outer electrode material 17, as shown. Protective material 20 protects at least outer electrode material 17 during subsequent processing. For example, material 20 may protect outer electrode material 17 from contamination from undesired deposited material and/or in eliminating or at least reducing implant damage to material 17 caused by a subsequent ion implant that is described below. Protective material 20 may be dielectric, semiconductive, and/or conductive. Example dielectric materials include SiO, SiN, SiON, SiC, SiCN, SiOC, SiCON, AlO, AlN, and AlON. Example semiconductive materials include doped or undoped polysilicon, monocyrstalline silicon, and amorphous silicon. Example conductive materials include TiN, TiON, TaN, WN, Al, and Ti. Protective material 20 may comprise any one or more of these materials. An example thickness range for protective material 20 is from about 5 Å to about 500 Å, with from about 25 Å to about 100 Å being a more specific example. The thickness chosen may be based in part upon the composition(s) of the protective material to impart a protective function. For example, different composition materials have different degrees of protective blocking power with respect to ion implantation beneath or into elevationally lower portions of outer electrode material 17 and which therefore may impact the chosen thickness for protective material 20. In one embodiment, formation of the protective material over the outer electrode material occurs at a temperature below 400° C., and in one embodiment below 320° C., to minimize thermal impact to previously deposited material underlying protective material 20. Protective material 20 may be wholly sacrificial, partially sacrificial, or not at all sacrificial, and accordingly may at least in part remain as part of the finished circuitry construction in some embodiments.

Figure 3:
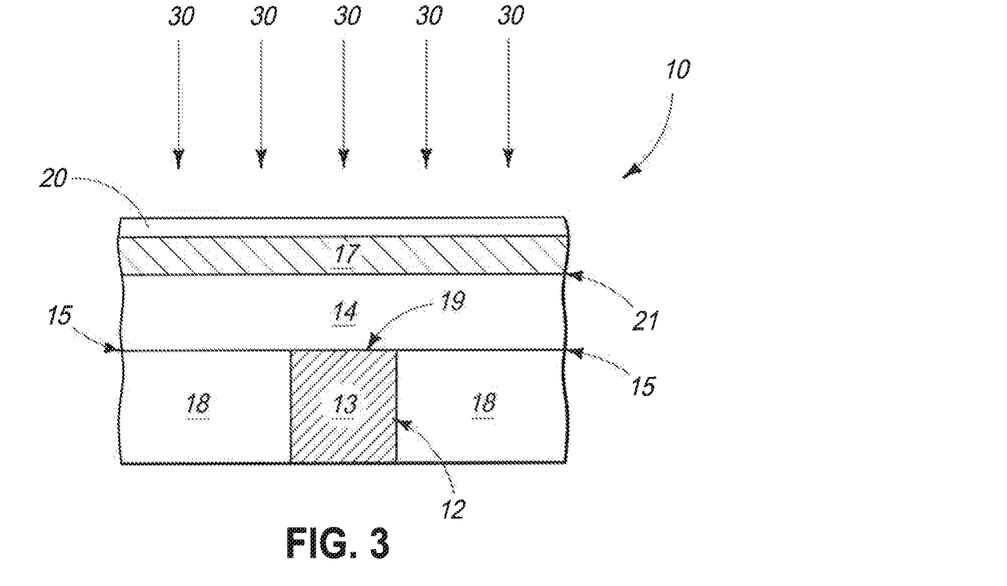
FIG. 3 is a view of the FIG. 2 substrate at a processing step subsequent to that shown by FIG. 2.

Referring to FIG. 3, dopant 30 is ion implanted through protective material 20 into outer electrode material 17 and programmable material 14 across interface 21 to enhance adhesion of outer electrode material 17 and programmable material 14 relative one another across interface 21. Accordingly, in one embodiment, the ion implanting is targeted at least toward interface 21. Enhancing of adhesion of outer electrode material 17 and programmable material 14 relative one another across interface 21 may alleviate or prevent the delamination problems discussed above in the "Background" section. The dopant may comprise or be derived from any suitable dopant species, or combination of dopant species, and may be implanted to any suitable dose. Example dopant includes one or more of arsenic, boron, phosphorous, carbon, germanium, argon, nitrogen, antimony, indium, selenium, and xenon. An example total dose is about $1 \times 10^{14}$ atoms/cm$^2$ to about $1 \times 10^{18}$ atoms/cm$^2$, with about $1 \times 10^{15}$ atoms/cm$^2$ being a specific example. The dopant may comprise an ionized molecule (e.g., $BF_2^+$), and/or may comprise metal. Example materials from which the dopant may be derived during implanting include $BF_3$, $B_2H_6$, $AsH_3$, $PH_3$, $CH_4$, $BH_3$, and $GeH_4$. The implant energy may be chosen by the artisan to obtain high dopant concentration at interface 21, and/or perhaps at other interfaces. For example for atoms with atomic mass unites (AMU) from 1 to 150, energy may be in the range of from about 500V to about 1 MeV depending on thickness of material through which the atoms are implanted as targeted to a specific interface. Regardless, any existing or yet-to-be developed ion implanting techniques may be used, for example beam-line ion implanting and/or PLAD, and at any suitable temperature.

Figure 4:
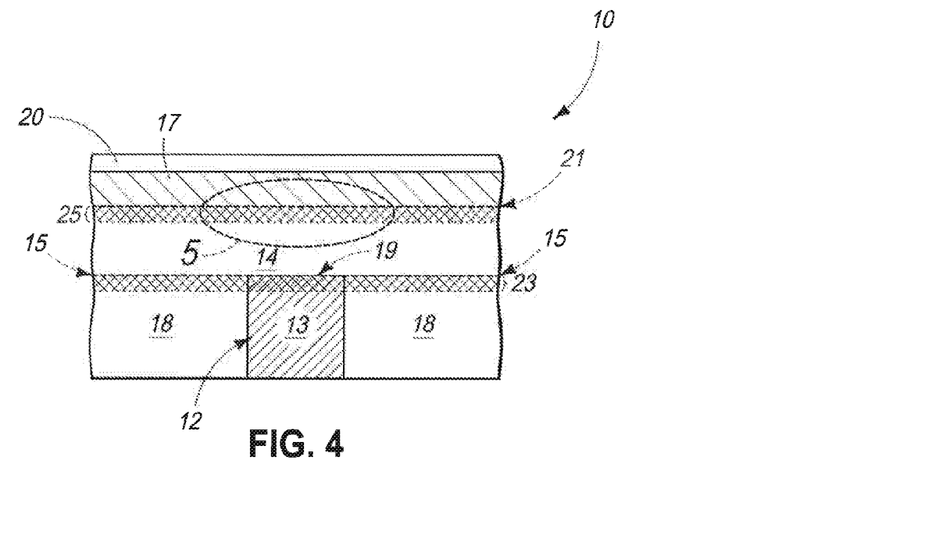
FIG. 4 is a view of the FIG. 3 substrate at a processing step subsequent to that shown by FIG. 3.
Figure 5:
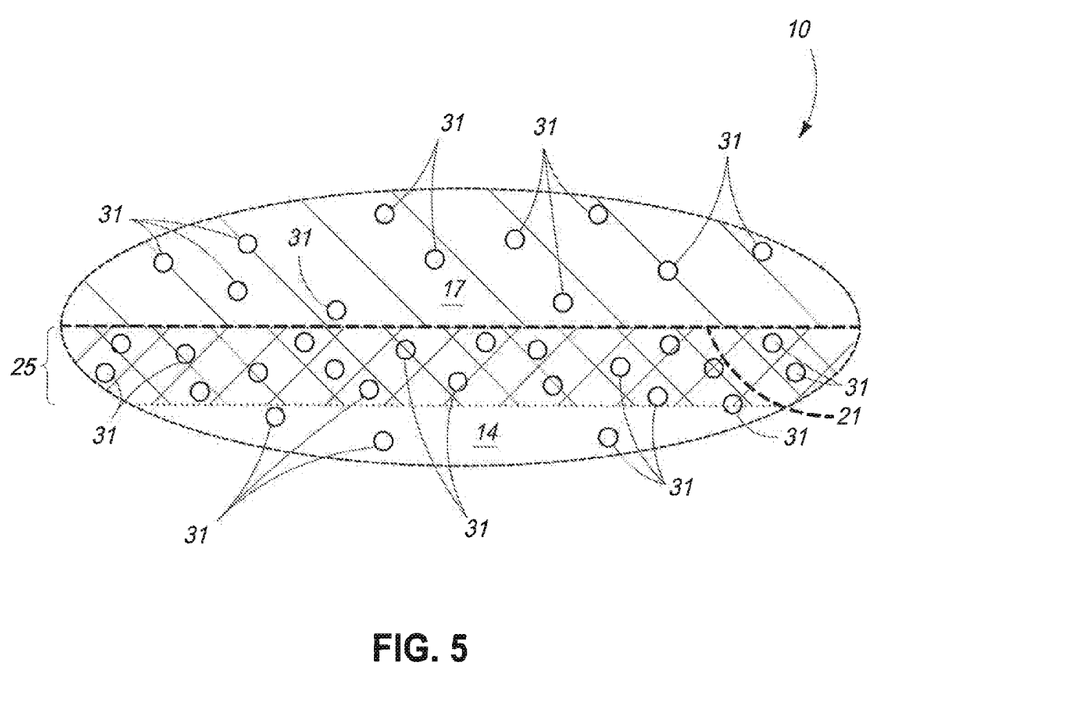
FIG. 5 is an enlarged view of a portion of FIG. 4.

FIG. 4 shows substrate 10 after the implanting of the dopant in FIG. 3, and shows interface 21 transformed into a boundary region 25 which is characterized at least in part by a damage-producing ion implanted dopant (e.g., indicated as dopant circles 31 in FIG. 5) in both outer electrode material 17 and programmable material 14, with boundary region 25 being a relatively diffuse band as compared to original interface 21. An example initial location of interface 21 is shown with a dashed line. Original interface 21 is diagrammatically shown as constituting the top of boundary region 25, although such may be received elevationally within boundary region 25. FIG. 5 is an enlarged view of the ellipse encircled portion in FIG. 4. Damage-producing implanted dopant 31 from dopant 30 (FIG. 3) may impart damage to outer electrode material 17 and programmable material 14 which may result in the intermixing of these materials across and adjacent initial interface 21. The intermixing may be due to a "knock-on" effect and can be simulated by computer. The intermixing may be detected by any suitable analytical technique, such as, for example, secondary ion mask spectroscopy.

Alternatively or in addition to causing the intermixing, the ion implanting may destroy some chemical bonds along interface 21 and within the bulk materials 14 and 17 in which the implanted dopant 31 resides. Bonding may be subsequently reconstructed along interface 21 (in some embodiments the reconstruction may be enhanced by subsequent thermal annealing). In other words, a combination of a bond-breaking implant and subsequent thermal anneal may increase an amount of bonding between programmable material 14 and outer electrode material 17 than existed between such materials prior to the implant and thermal anneal. In one embodiment, any thermal anneal is conducted at a temperature of less than or equal to 400° C., with a specific example being at a temperature of at least about 350° C. for about 10 minutes.

The damage induced by the dopant may include generation of dangling bonds and/or the alteration of crystallinity within programmable material 14 and/or outer electrode material 17. For instance, one or both of the programmable material and the outer electrode material may have a crystallinity along the initial interface 21 and may have an initial concentration of dangling bonds (which may be about 0 in some embodiments). The crystallinity may be reduced by the impacting dopant and/or the concentration of dangling bonds may be increased. Reduced crystallinity may be detected by any suitable technology including, for example, measurement of x-ray diffraction. If the change in crystallinity occurs in the outer electrode material, such change may remain in the memory cell after multiple read/write cycles. In contrast, if the change in crystallinity occurs in the programmable material, such change may essentially disappear after a couple of read/write cycles since such read/write cycles may comprise alteration of the phase of programmable material between crystalline and amorphous phases. Increased concentrations of dangling bonds along interface 21 may improve adhesion of materials 14 and 17 along such interface if the dangling bonds subsequently recombine to form bonds extending across such interface. Such recombination may be induced by thermal annealing (such as thermal treatment at a temperature of about 350° C.) in some embodiments.

Regardless, the act of ion implanting may effectively transform protective material 20 into a damaged material which is elevationally over outer electrode material 17 and that is damaged by the damage-producing implanted dopant. As an example, the damage referred to may be one or both of presence of atoms of the dopant in the material and alteration of the crystalline lattice of a crystalline material. Regardless, in one embodiment, the implant-damaged material 20 is directly against the outer electrode material. Regardless, the implant-damaged material may be dielectric, semiconductive, and/or conductive (i.e., after the act of implanting).

FIG. 4 also shows an example construction wherein interfaces 15 and 19 have been transformed into a boundary region 23, with the initial location of interfaces 15 and 19 being shown with dashed lines. Boundary region 23 and original interfaces 15 and 19 may have any of the attributes described above with respect to boundary region 25 and interface 21. Ion implanting to form boundary regions 23 and 25 may be conducted simultaneously (e.g., using different species and/or the same or different energies at the same time), and/or using multiple separate ion implanting steps at different times.

Figure 6:
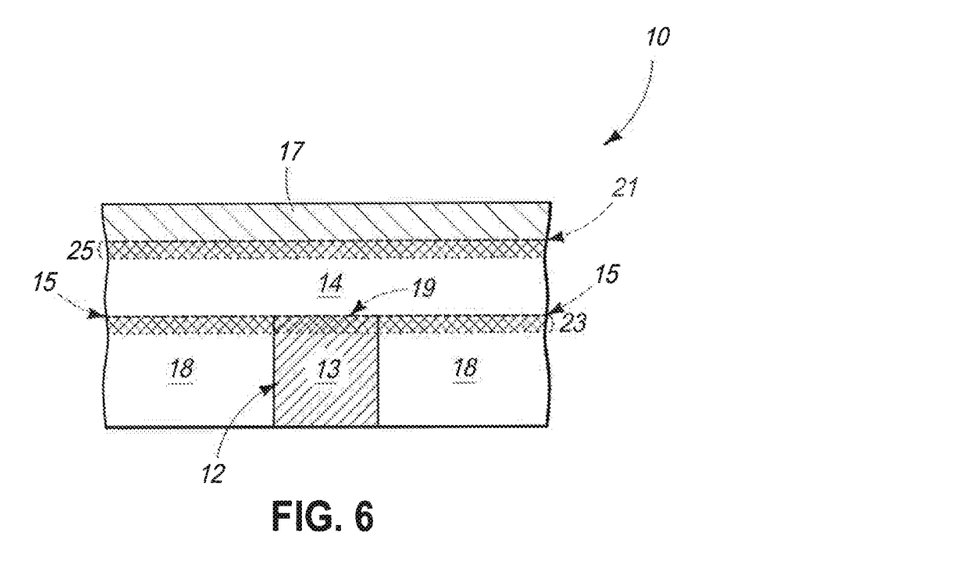
FIG. 6 is a view of the FIG. 4 substrate at a processing step subsequent to that shown by FIG. 4.

Referring to FIG. 6, and in one embodiment, all of protective material 20 (not shown) has been removed after the act of implanting of FIG. 3.

Figure 7:
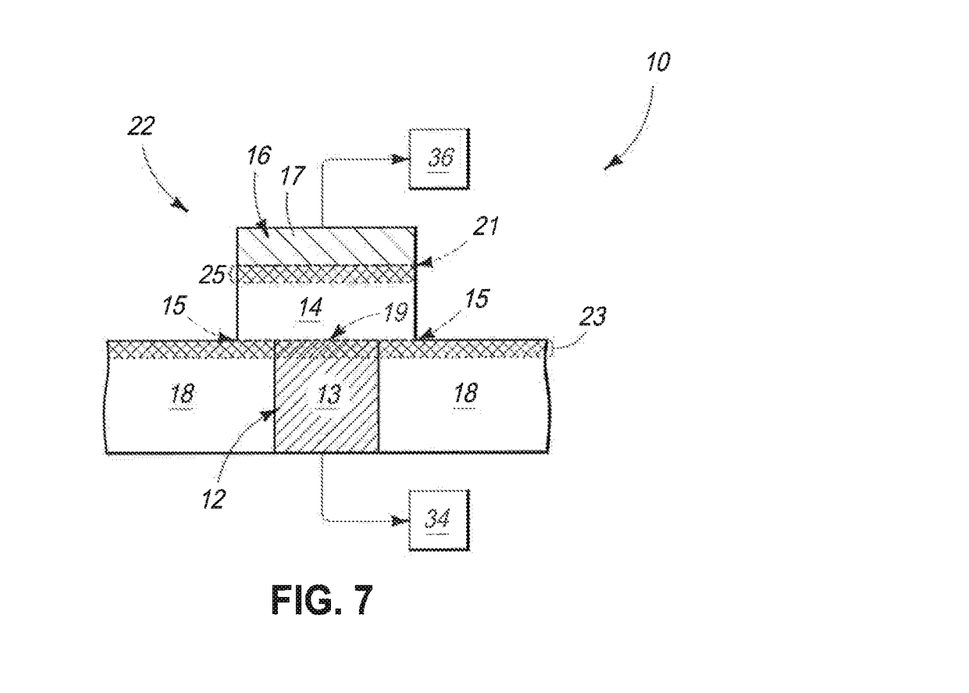
FIG. 7 is a view of the FIG. 6 substrate at a processing step subsequent to that shown by FIG. 6.

Referring to FIG. 7, outer electrode material 17 and programmable material 14 have been patterned to form a memory cell structure 22 comprising an outer electrode 16, inner electrode 12, and programmable material 14 there-between. An example patterning technique is photolithographic patterning and etch.

Figure 8:
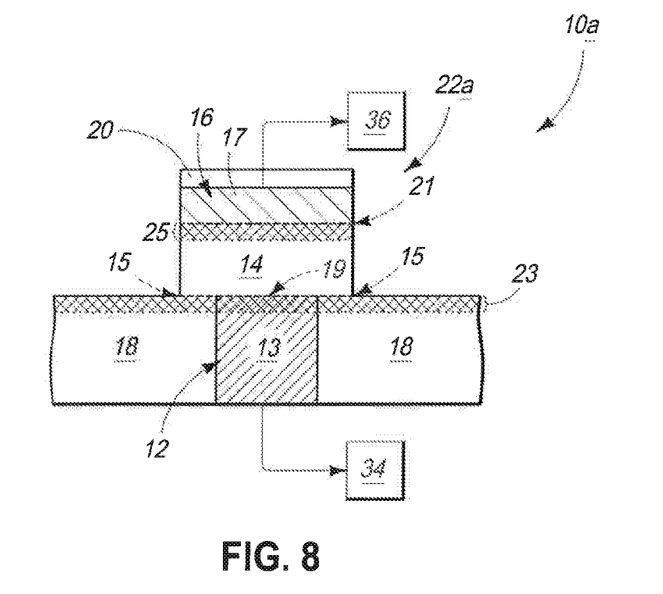
FIG. 8 is a view of an alternate substrate in accordance with an embodiment of the invention.

As an alternate embodiment, some or all of the protective material may remain over the outer electrode material in a finished circuitry construction incorporating the memory cell, for example as shown in FIG. 8 with respect to a substrate 10a. Like numerals from the above-described embodiments have been used where appropriate. Protective material 20, which may constitute implant-damaged material, remains over outer electrode material 17 of memory cell 22a in the depicted construction. Some of protective material 20 may be removed (not shown) in the embodiment of FIG. 8. For example, protective material 20 may be completely removed at some locations to provide access for conductive material (not shown) to make electrical connection with outer electrode material 17. Additionally or alternately, protective material 20 may be thinned (not shown) from its initial thickness.

FIGS. 1-8 show example embodiments wherein outer electrode material 17 and programmable material 14 were patterned after the implanting of FIG. 3. Alternately, any such patterning may occur before the implanting of FIG. 3. Further, materials 17, 14, and 13 might alternately be formed to have continuous sidewalls relative one another in a finished circuitry construction, for example as might occur if such were patterned using a single masking step. Further alternate memory cell structures may be used.

The memory cell structures of FIGS. 7 and 8 may be, respectively, one of a large number of identical memory cell structures that are simultaneously fabricated. Such memory cell structures may be incorporated into a memory array (e.g., a 3D cross-point array) by electrically connecting them to access lines and sense lines. For example, memory cell structure 22/22a may be incorporated into a memory array by electrically interconnecting or incorporating bottom electrode 12 with an access line (e.g., a wordline) 34, and electrically interconnecting or incorporating top electrode 16 with a sense line (e.g., a bitline) 36 (or vice versa). A select device (not shown in FIGS. 7 and 8), such as a diode or ovonic threshold or other switch, may be provided between the bottom electrode and the access line and/or between the top electrode and the bitline.

Embodiments of the invention also encompass enhancing adhesion of programmable material that is directly against inner electrode material independent of the outer electrode material relative to the programmable material. In one embodiment, a method of forming a memory cell comprises forming programmable material elevationally over and directly against an inner electrode material. The programmable material and the inner electrode material contact one another along an interface. An outer electrode material is formed elevationally over the programmable material. Dopant is implanted through the protective material and the outer electrode material into the programmable material and into the inner electrode material and across the interface to enhance adhesion of the programmable material and the inner electrode material relative one another across the interface. Any other attribute as described above may apply with respect to the interface between contacting programmable material and inner electrode material.

Figure 9:
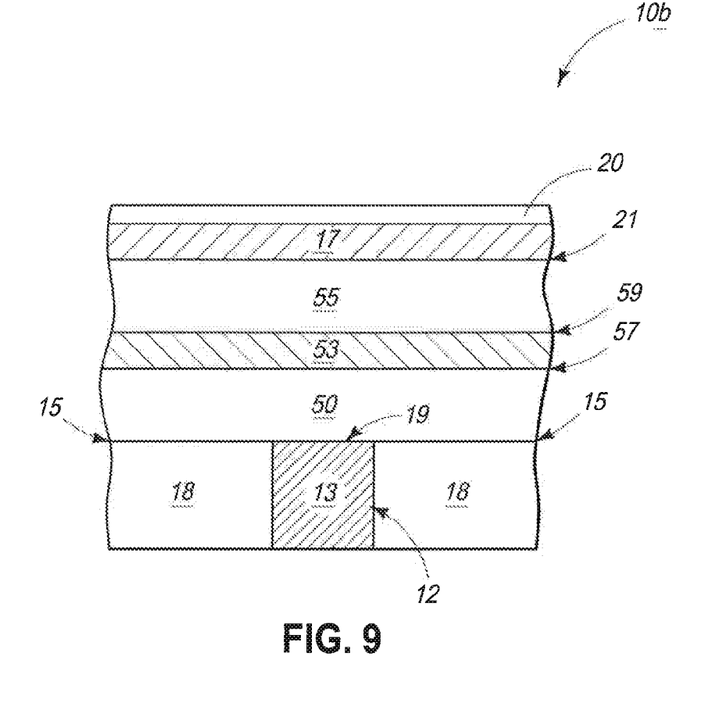
FIG. 9 is a diagrammatic sectional view of an alternate substrate in process in accordance with an embodiment of the invention.
Figure 10:
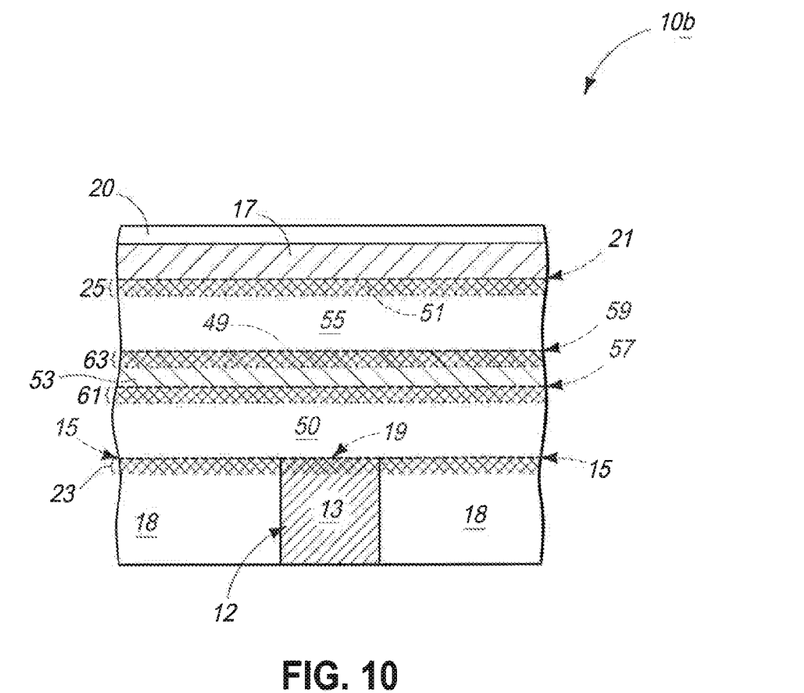
FIG. 10 is a view of the FIG. 9 substrate at a processing step subsequent to that shown by FIG. 9.
Figure 11:
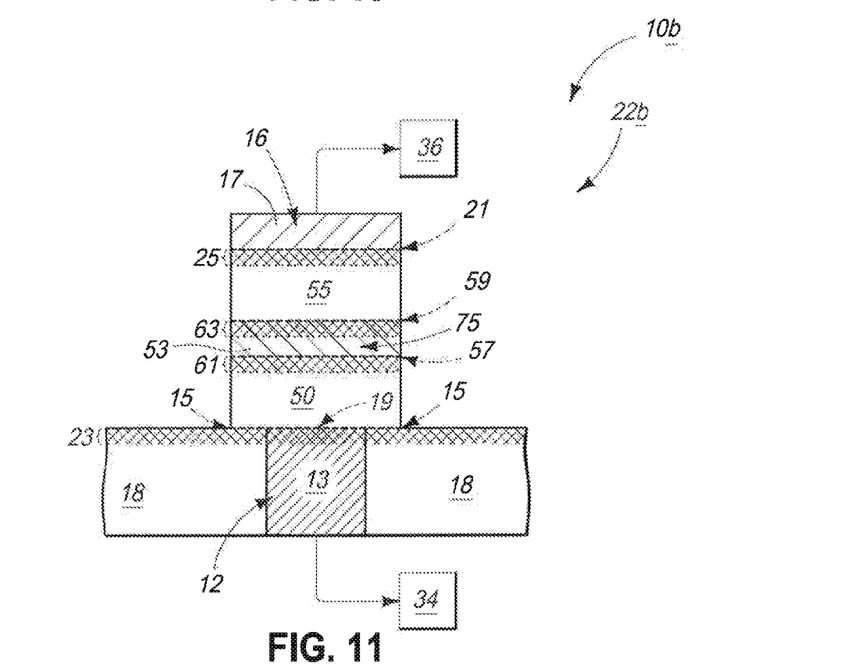
FIG. 11 is a view of the FIG. 10 substrate at a processing step subsequent to that shown by FIG. 10.

FIGS. 9-11 illustrate an example embodiment method in which a select device is fabricated as part of a memory cell structure. Like numerals from the above-described embodiments have been used where appropriate, with some construction differences being indicated with the suffix "b" or with different numerals. Referring to FIG. 9, one of select device material or programmable material has been formed elevationally over first electrode material 13, and is indicated with numeral 50. Accordingly, material 50 may comprise programmable material 14 of the above-described embodiments. If select device material, any suitable material(s) may be used depending upon the select device being fabricated. One example select device material is ovonic material, for example in fabrication of an ovonic threshold switch. Example such materials comprise one or more of germanium, arsenic, selenium, tellurium, and silicon, with some specific examples comprising AsSe, AsSeGe, AsSeGeTe, and AsGeTeSi.

Second electrode material 53 is formed elevationally over the one material 50. Examples include any of the materials described above for electrode materials 13 and 17. The other of the select device material or the programmable material is formed elevationally over second electrode material 53, and is indicated with numeral 55. Third electrode material 17 is formed elevationally over other material 55. Protective material 20 is formed elevationally over third electrode material 17.

The various materials may be directly against one another or have other material there-between. Nevertheless, at least one of a) the one material 50 and first electrode material 13 contact one another along a first interface (e.g., interface 19), b) the one material 50 and second electrode material 53 contact one another along a second interface (e.g., an interface 57), c) the other material 55 and second electrode material 53 contact one another along a third interface (e.g., an interface 59), and d) third electrode material 17 and the other material 55 contact one another along a fourth interface (e.g., interface 21). All of the a, b, c, and d conditions are shown as being met in FIG. 9, although only one, two, or three of such may be met.

Dopant is implanted through the protective material along any of at least one of the first, second, third, and fourth interface. Protective material 20 will likely be implant-damaged in the process. The dopant may be implanted along only one of any of the first, second, third, and fourth interface; along more than one of any such interface, and in one embodiment along each of the first, second, third, and fourth interfaces. Regardless, the dopant may be implanted into both of the contacting materials of any of said at least one first, second, third, and fourth interface, with the act of implanting enhancing adhesion of such contacting materials across any of such at least one first, second, third, and fourth interface. FIG. 10 depicts an example wherein implanting has ultimately occurred along each of the depicted four interfaces, and additionally wherein a first boundary region 23, a second boundary region 61, a third boundary region 63, and a fourth boundary region 25 have been formed. In the depicted example, each is characterized at least in part by a damage-producing ion implanted dopant (for example as described above) in both of i) the one or other material 50, 55, and ii) the first electrode material 13, the second electrode material 53, or the third electrode material 17, that are directly against one another.

Referring to FIG. 11, protective material 20 (not shown) has been removed, and materials 17, 55, 53, and 50 have been patterned to produce memory cell structure 22b which comprises inner electrode 12, the one material 50, a second electrode 75, the other material 55, and outer electrode 16. Inner electrode 12 and outer electrode 16 may be associated with select or access lines 34, 36 as shown and described with respect to the above embodiments. Processing and resultant structure may additionally or alternately occur as described above. For example, the stated implanting may occur before or after patterning to produce a substantially complete memory cell structure 22b.

Figure 12:
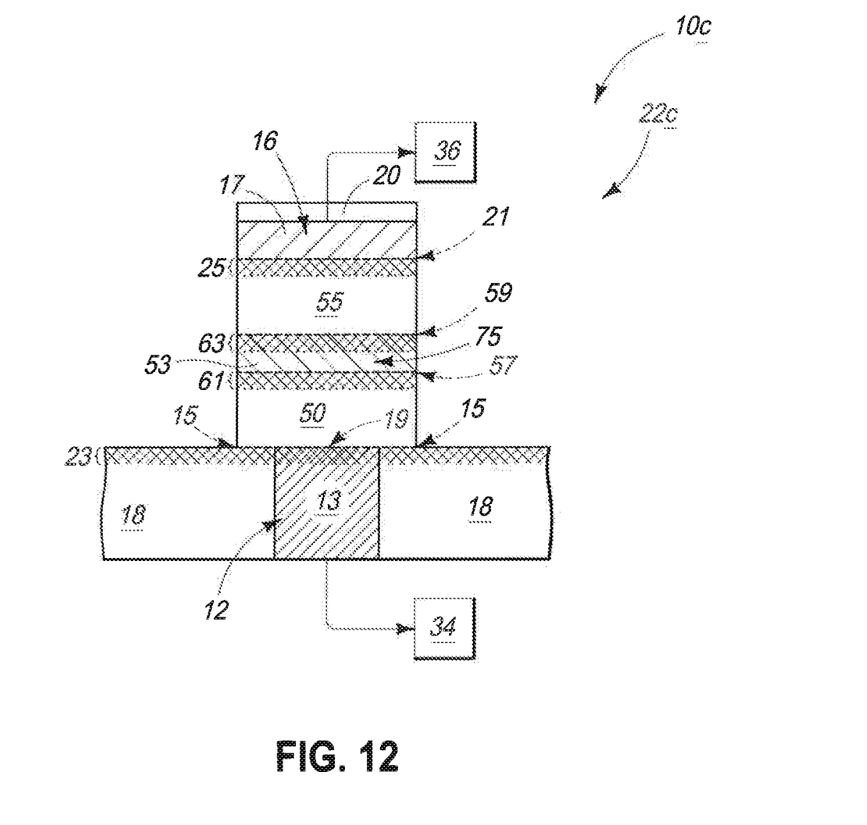
FIG. 12 is a view of an alternate substrate in accordance with an embodiment of the invention.

Additionally, an implant-damaged material 20 may comprise part of the finished-circuitry construction, for example as shown in an alternate embodiment construction 10c in FIG. 12. Like numerals from the FIG. 11 embodiment have been used where appropriate, with some construction differences being indicated with the suffix "c".

Embodiments of the invention also encompass memory cells. In one such embodiment, an elevationally outer electrode material (e.g., material 17) and an elevationally inner electrode material (e.g., material 13) have programmable material elevationally there-between (e.g., material 14 or 55). The outer electrode material and the programmable material are directly against one another along a boundary region (e.g., region 25) characterized at least in part by a damage-producing ion implanted dopant in both the outer electrode material and the programmable material. An implant-damaged material (e.g., material 20 in FIGS. 8 and 12) is elevationally over the outer electrode material and that is damaged by the damage-producing implanted dopant. Any other attribute as described above may be used in the memory cell embodiments.

In one embodiment, a memory cell comprises an elevationally outer electrode material and an elevationally inner electrode material having programmable material elevationally there-between. The inner electrode material and the programmable material are directly against one another along a boundary region (e.g., region 23) characterized at least in part by a damage-producing ion implanted dopant in both the programmable material and the inner electrode programmable material. An implant-damaged material is elevationally over the outer electrode material and that is damaged by the damage-producing implanted dopant. Any other attribute as described above may be used.

In one embodiment, a memory cell comprises one of select device material or programmable material elevationally over a first electrode (e.g., material 50 over first electrode 12 in FIG. 12). A second electrode is elevationally over the one material (e.g., second electrode 75 that is elevationally over the one material 50). The other of select device material or programmable material is elevationally over the second electrode (e.g., other material 55 that is elevationally over second electrode 75). A third electrode is elevationally over the other material (e.g., third electrode 16 that is elevationally over the other material 55).

At least one of a) the one material and the first electrode are directly against one another along a first boundary region (e.g., boundary region 23), b) the one material and the second electrode are directly against one another along a second boundary region (e.g., boundary region 61), c) the other material and the second electrode are directly against one another along a third boundary region (e.g., boundary region 63), and d) the third electrode and the other material are directly against one another along a fourth boundary region (e.g., boundary region 25). At least one of any of said first, second, third, and fourth boundary region is characterized at least in part by a damage-producing ion implanted dopant in both of i) the one or other material and ii) the first, second, or third electrode, that are directly against one another. An implant-damaged material (e.g., material 20 in FIG. 12) is elevationally over the third electrode that is damaged by the damage-producing implanted dopant. Any other attribute as described above may be used.

CONCLUSION

In some embodiments, a method of forming a memory cell comprises forming an outer electrode material elevationally over and directly against a programmable material. The programmable material and the outer electrode material contact one another along an interface. Protective material is formed elevationally over the outer electrode material. Dopant is implanted through the protective material into the outer electrode material and the programmable material and across the interface to enhance adhesion of the outer electrode material and the programmable material relative one another across the interface.

In some embodiments, a method of forming a memory cell comprises forming programmable material elevationally over and directly against an inner electrode material. The programmable material and the inner electrode material contact one another along an interface. An outer electrode material is formed elevationally over the programmable material. Dopant is implanted through the protective material and the outer electrode material into the programmable material and into the inner electrode material and across the interface to enhance adhesion of the programmable material and the inner electrode material relative one another across the interface.

In some embodiments, a method of forming a memory cell comprises forming one of select device material or programmable material elevationally over a first electrode material. Second electrode material is formed elevationally over the one material. The other of the select device material or the programmable material is formed elevationally over the second electrode material. Third electrode material is formed elevationally over the other material. Protective material if formed elevationally over the third electrode material. At least one of a) the one material and the first electrode material contacts one another along a first interface, b) the other material and the second electrode material contacts one another along a second interface, and c) the second electrode material and the other material contacts one another along a third interface. Dopant is implanted through the protective material along any of at least one of the first, second, and third interface. The dopant is implanted into both of the contacting materials of any of said at least one first, second, and third interface. The implanting enhances adhesion of the contacting materials across any of said at least one first, second, and third interface.

In some embodiments, a memory cell comprises elevationally outer electrode material and elevationally inner electrode material having programmable material elevationally therebetween. The outer electrode material and the programmable material are directly against one another along a boundary region characterized at least in part by a damage-producing ion implanted dopant in both the outer electrode material and the programmable material. An implant-damaged material is elevationally over the outer electrode material and that is damaged by the damage-producing implanted dopant.

In some embodiments, a memory cell comprises elevationally outer electrode material and elevationally inner electrode material having programmable material elevationally therebetween. The inner electrode material and the programmable material are directly against one another along a boundary region characterized at least in part by a damage-producing ion implanted dopant in both the programmable material and the inner electrode programmable material. An implant-damaged material is elevationally over the outer electrode material and that is damaged by the damage-producing implanted dopant.

In some embodiments, a memory cell comprises one of select device material or programmable material elevationally over a first electrode. A second electrode is elevationally over the one material. The other of select device material or programmable material is elevationally over the second electrode. A third electrode is elevationally over the programmable material. At least one of a) the one material and the first electrode are directly against one another along a first boundary region, b) the one material and the second electrode are directly against one another along a second boundary region, and c) the second electrode and the other material are directly against one another along a third boundary region. At least one of any of said first, second, and third boundary region is characterized at least in part by a damage-producing ion implanted dopant in both of the one or other material and the first or second electrode that are directly against one another. An implant-damaged material is elevationally over the third electrode that is damaged by the damage-producing implanted dopant.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory cell, comprising:
   forming an outer electrode material elevationally over and directly against a programmable material, the programmable material and the outer electrode material contacting one another along an interface, the outer electrode material being material of an elevationally outermost electrode of the memory cell being formed;
   forming protective material elevationally over the outer electrode material; and
   implanting dopant through the protective material into the outer electrode material and the programmable material and across the interface to enhance adhesion of the outer electrode material and the programmable material relative one another across the interface.

2. The method of claim 1 wherein the implanting intermixes the programmable material and the outer electrode material across the interface.

3. The method of claim 1 wherein the implanting breaks bonds along the interface, and further comprising using a thermal anneal to reconstruct bonds along the interface, the thermal anneal increasing an amount of bonding between the programmable material and the outer electrode material relative to an amount of such bonding prior to the implanting and the thermal anneal.

4. A method of forming a memory cell, comprising:
   forming an outer electrode material elevationally over and directly against a programmable material, the programmable material and the outer electrode material contacting one another along an interface;
forming protective material elevationally over the outer electrode material, the protective material being dielectric; and
implanting dopant through the protective material into the outer electrode material and the programmable material and across the interface to enhance adhesion of the outer electrode material and the programmable material relative one another across the interface.

5. The method of claim 1 wherein the protective material is semiconductive.

6. The method of claim 1 wherein the protective material is conductive.

7. A method of forming a memory cell, comprising:
forming an outer electrode material elevationally over and directly against a programmable material, the programmable material and the outer electrode material contacting one another along an interface;
forming protective material elevationally over the outer electrode material;
implanting dopant through the protective material into the outer electrode material and the programmable material and across the interface to enhance adhesion of the outer electrode material and the programmable material relative one another across the interface; and
removing all of the protective material after the implanting.

8. The method of claim 1 wherein the protective material is directly against the outer electrode material.

9. The method of claim 1 wherein the protective material remains over the outer electrode material of the memory cell in a finished circuitry construction incorporating the memory cell.

10. The method of claim 9 wherein the remaining protective material is directly against the outer electrode material.

11. A method of forming a memory cell, comprising:
forming an outer electrode material elevationally over and directly against a programmable material, the programmable material and the outer electrode material contacting one another along an interface;
forming protective material elevationally over the outer electrode material;
implanting dopant through the protective material into the outer electrode material and the programmable material and across the interface to enhance adhesion of the outer electrode material and the programmable material relative one another across the interface; and
the protective material remaining over the outer electrode material of the memory cell in a finished circuitry construction incorporating the memory cell, removing some of the protective material after the implanting.

12. The method of claim 1 comprising patterning the outer electrode material and the programmable material after the implanting.

13. The method of claim 1 comprising patterning the outer electrode material and the programmable material before the implanting.

14. The method of claim 1 wherein forming the protective material occurs at a temperature below 400° C.

15. A method of forming a memory cell, comprising:
forming an outer electrode material elevationally over and directly against a programmable material, the programmable material and the outer electrode material contacting one another along an interface;
forming protective material elevationally over the outer electrode material, the protective material comprising one or more of SiO, SiN, SiON, SiC, SiCN, SiOC, SiCON, AlO, AlN, AlON, TiON, TaON, TaN, and Al; and
implanting dopant through the protective material into the outer electrode material and the programmable material and across the interface to enhance adhesion of the outer electrode material and the programmable material relative one another across the interface.

16. The method of claim 1 wherein the dopant comprises one or more of arsenic, boron, phosphorus, carbon, germanium, argon, nitrogen, antimony, indium, and xenon.

17. A method of forming a memory cell, comprising:
forming programmable material elevationally over and directly against an inner electrode material, the programmable material and the inner electrode material contacting one another along an interface;
forming an outer electrode material elevationally over the programmable material, the outer electrode material being material of an elevationally outermost electrode of the memory cell being formed;
forming protective material elevationally over the outer electrode material; and
implanting dopant through the protective material and the outer electrode material into the programmable material and into the inner electrode material and across the interface to enhance adhesion of the programmable material and the inner electrode material relative one another across the interface.

18. A method of forming a memory cell, comprising:
forming one of select device material or programmable material elevationally over a first electrode material;
forming second electrode material elevationally over the one material;
forming the other of the select device material or the programmable material elevationally over the second electrode material;
forming third electrode material elevationally over the other material;
forming protective material elevationally over the third electrode material;
at least one of a) the one material and the first electrode material contacting one another along a first interface, b) the one material and the second electrode material contacting one another along a second interface, c) the other material and the second electrode material contacting one another along a third interface, and d) the third electrode material and the other material contacting one another along a fourth interface; and
implanting dopant through the protective material along any of at least one of the first, second, third, and fourth interface; the dopant being implanted into both of the contacting materials of any of said at least one first, second, third, and fourth interface; the implanting enhancing adhesion of the contacting materials across any of said at least one first, second, third, and fourth interface.

19. The method of claim 18 wherein the implanting is along only one of any of the first, second, third, and fourth interfaces.

20. The method of claim 18 wherein the implanting is along more than one of any of the first, second, third, and fourth interfaces.

21. The method of claim 20 wherein the implanting is along each of the first, second, third, and fourth interfaces.

22. The method of claim 20 wherein the implanting along at least two of the first, second, third, and fourth interfaces is conducted simultaneously.

23. The method of claim 20 wherein the implanting along at least two of the first, second, third, and fourth interfaces is conducted at different times.

24. A memory cell comprising:
elevationally outer electrode material and elevationally inner electrode material having programmable material elevationally there-between, the outer electrode material and the programmable material being directly against one another along a boundary region characterized at least in part by a damage-producing ion implanted dopant in both the outer electrode material and the programmable material, the outer electrode material being material of an elevationally outermost electrode of the memory cell; and
an implant-damaged material elevationally over the outer electrode material and that is damaged by the damage-producing implanted dopant.

25. The memory cell of claim 24 wherein the implant-damaged material is dielectric.

26. The memory cell of claim 24 wherein the implant-damaged material is semiconductive.

27. The memory cell of claim 24 wherein the implant-damaged material is conductive.

28. The memory cell of claim 24 wherein the implant-damaged material has a thickness of from 5 Angstroms to 500 Angstroms.

29. The memory cell of claim 24 wherein the implant-damaged material is directly against the outer electrode material.

30. The memory cell of claim 24 wherein the implant-damaged material comprises one or more of SiO, SiN, SiON, SiC, SiCN, SiOC, SiCON, AlO, AlN, AlON, TiN, TiON, TaON, TaN, WN, Ti polysilicon, monocrystalline silicon, amorphous silicon and Al.

31. The memory cell of claim 24 wherein the implant-damaged material comprises Al.

32. The memory cell of claim 24 wherein the implant-damaged material comprises SiC.

33. The memory cell of claim 24 wherein the implant-damaged material comprises SiCN.

34. The memory cell of claim 24 wherein the implant-damaged material comprises SiOC.

35. The memory cell of claim 24 wherein the implant-damaged material comprises SiCON.

36. The memory cell of claim 24 wherein the implant-damaged material comprises AlN.

37. The memory cell of claim 24 wherein the implant-damaged material comprises AlON.

38. The memory cell of claim 24 wherein the implant-damaged material comprises TiON.

39. The memory cell of claim 24 wherein the implant-damaged material comprises TaON.

40. A memory cell comprising:
elevationally outer electrode material and elevationally inner electrode material having programmable material elevationally there-between, the inner electrode material and the programmable material being directly against one another along a boundary region characterized at least in part by a damage-producing ion implanted dopant in both the programmable material and the inner electrode material, the outer electrode material being material of an elevationally outermost electrode of the memory cell; and
an implant-damaged material elevationally over the outer electrode material and that is damaged by the damage-producing implanted dopant.

41. A memory cell comprising:
one of select device material or programmable material elevationally over a first electrode;
a second electrode elevationally over the one material;
the other of select device material or programmable material elevationally over the second electrode;
a third electrode elevationally over the other material;
at least one of a) the one material and the first electrode being directly against one another along a first boundary region, b) the one material and the second electrode being directly against one another along a second boundary region, c) the other material and the second electrode being directly against one another along a third boundary region, and d) the third electrode and the other material being directly against one another along a fourth boundary region; at least one of any of said first, second, third, and fourth third boundary region being characterized at least in part by a damage-producing ion implanted dopant in both of i) the one or other material and ii) the first, second, or third electrode, that are directly against one another; and
an implant-damaged material elevationally over the third electrode that is damaged by the damage-producing implanted dopant.

42. The memory cell of claim 41 wherein the one material and the first electrode are directly against one another along the first boundary region.

43. The memory cell of claim 41 wherein the one material and the second electrode are directly against one another along the second boundary region.

44. The memory cell of claim 41 wherein the second electrode and the other material are directly against one another along the third boundary region.

45. The memory cell of claim 41 wherein the third electrode and the other material are directly against one another along the fourth boundary region.

46. A method of forming a memory cell, comprising:
forming an outer electrode material elevationally over and directly against a programmable material, the programmable material and the outer electrode material contacting one another along an interface;
forming protective material elevationally over the outer electrode material, the forming the protective material occurring at a temperature below 400° C.; and
implanting dopant through the protective material into the outer electrode material and the programmable material and across the interface to enhance adhesion of the outer electrode material and the programmable material relative one another across the interface.

47. A memory cell comprising:
elevationally outer electrode material and elevationally inner electrode material having programmable material elevationally there-between, the outer electrode material and the programmable material being directly against one another along a boundary region characterized at least in part by a damage-producing ion implanted dopant in both the outer electrode material and the programmable material; and
an implant-damaged material elevationally over the outer electrode material and that is damaged by the damage-producing implanted dopant.

48. A memory cell comprising:
elevationally outer electrode material and elevationally inner electrode material having programmable material elevationally there-between, the inner electrode material and the programmable material being directly against one another along a boundary region characterized at least in part by a damage-producing ion implanted dopant in both the programmable material and the inner electrode material; and an implant-damaged material elevationally over the outer electrode material and that is damaged by the damage-producing implanted dopant.

\* \* \* \* \*